US009577358B2

(12) United States Patent
Beroz

(10) Patent No.: US 9,577,358 B2
(45) Date of Patent: Feb. 21, 2017

(54) FLUID PRESSURE ACTIVATED ELECTRICAL CONTACT DEVICES AND METHODS

(71) Applicant: ComponentZee, LLC, Apex, NC (US)

(72) Inventor: Masud Beroz, Apex, NC (US)

( * ) Notice: Subject to any disclaimer, the term of this patent is extended or adjusted under 35 U.S.C. 154(b) by 0 days.

(21) Appl. No.: 14/723,412

(22) Filed: May 27, 2015

(65) Prior Publication Data

US 2016/0118737 A1    Apr. 28, 2016

Related U.S. Application Data

(60) Provisional application No. 62/068,663, filed on Oct. 25, 2014, provisional application No. 62/096,843, filed on Oct. 29, 2014, provisional application No. 62/076,072, filed on Nov. 6, 2014.

(51) Int. Cl.
| | | |
|---|---|---|
| *H01R 12/71* | (2011.01) | |
| *H01R 12/73* | (2011.01) | |
| *H05K 7/10* | (2006.01) | |

(52) U.S. Cl.
CPC ........... *H01R 12/714* (2013.01); *H01R 12/73* (2013.01); *H05K 7/10* (2013.01)

(58) Field of Classification Search
USPC .............. 439/656, 816, 67, 197; 324/756.03, 324/750.03, 754.15
See application file for complete search history.

(56) References Cited

U.S. PATENT DOCUMENTS

| | | | | | |
|---|---|---|---|---|---|
| 3,881,799 | A | * | 5/1975 | Elliott ...................... | H01R 4/26 174/253 |
| 5,012,187 | A | * | 4/1991 | Littlebury ............ | G01R 1/0735 324/72.5 |
| 5,105,537 | A | * | 4/1992 | Datta ..................... | H01R 13/22 205/667 |
| 5,172,050 | A | * | 12/1992 | Swapp ................. | G01R 1/0735 324/72.5 |
| 5,252,916 | A | * | 10/1993 | Swart ................. | G01R 1/07307 324/754.15 |
| 5,469,072 | A | * | 11/1995 | Williams ............. | G01R 1/0735 324/72.5 |
| 5,483,741 | A | * | 1/1996 | Akram ............... | G01R 1/06738 29/846 |

(Continued)

*Primary Examiner* — Alexander Gilman
(74) *Attorney, Agent, or Firm* — Niels Haun; Dann, Dorfman, Herrell and Skillman, P.C.

(57) ABSTRACT

A fluid pressure actuated device for establishing electrical contact includes a substrate defining a chamber, a flexible membrane having a first side facing a first direction away from the substrate and a second side facing into the chamber in a second direction opposite the first direction, and an electrically conducting contactor mounted on the first side of the flexible membrane. The flexible membrane extends and withdraws moving the electrically conducting contactor in the first direction and second direction respectively when fluid pressure is increased and decreased in the chamber. The flexible membrane includes at least two concentric frustum portions that narrow in opposite directions, including a central frustum portion and a second frustum portion that encircles the central frustum portion. Multiple chambers may be maintained in pressure equilibrium by at least one channel for the concurrent extension of multiple membranes and contactors.

20 Claims, 17 Drawing Sheets

(56) References Cited

U.S. PATENT DOCUMENTS

| | | | | |
|---|---|---|---|---|
| 5,506,514 A * | 4/1996 | Difrancesco | B23K 20/16 | |
| | | | 174/256 | |
| 5,550,482 A * | 8/1996 | Sano | G01R 31/2887 | |
| | | | 324/750.19 | |
| 5,604,446 A * | 2/1997 | Sano | G01R 1/0735 | |
| | | | 324/754.16 | |
| 5,625,298 A * | 4/1997 | Hirano | G01R 1/06744 | |
| | | | 324/750.05 | |
| 5,716,218 A * | 2/1998 | Farnworth | G01R 1/0466 | |
| | | | 257/E21.509 | |
| 5,825,192 A * | 10/1998 | Hagihara | G01R 31/2887 | |
| | | | 324/756.03 | |
| 5,869,974 A * | 2/1999 | Akram | G01R 31/02 | |
| | | | 324/754.15 | |
| 5,899,757 A * | 5/1999 | Neidich | H05K 3/4015 | |
| | | | 439/67 | |
| 6,045,026 A * | 4/2000 | Hembree | B23K 20/10 | |
| | | | 228/1.1 | |
| 6,072,321 A | 6/2000 | Akram et al. | | |
| 6,347,901 B1 * | 2/2002 | Park | B23K 3/06 | |
| | | | 228/141.1 | |
| 6,717,422 B2 * | 4/2004 | Akram | G01R 1/0483 | |
| | | | 324/750.16 | |
| 6,911,835 B2 * | 6/2005 | Chraft | G01R 1/07314 | |
| | | | 324/750.27 | |
| 7,195,503 B2 * | 3/2007 | Eldridge | G01R 1/0735 | |
| | | | 439/197 | |
| 7,455,540 B2 | 11/2008 | Eldridge | | |
| 7,521,292 B2 * | 4/2009 | Rogers | B82Y 10/00 | |
| | | | 257/40 | |
| 7,541,801 B2 * | 6/2009 | Nagasaka | G01R 31/2893 | |
| | | | 324/756.03 | |
| 7,576,553 B2 * | 8/2009 | Lou | G01R 31/2891 | |
| | | | 324/750.03 | |
| 7,967,621 B2 | 6/2011 | Eldridge | | |
| 7,990,168 B2 * | 8/2011 | Kim | G01R 1/07342 | |
| | | | 324/755.07 | |
| 8,659,312 B2 * | 2/2014 | Nakata | G01R 1/07 | |
| | | | 324/750.17 | |
| 8,803,539 B2 * | 8/2014 | Rathburn | G01R 1/07314 | |
| | | | 324/755.01 | |
| 2007/0103178 A1 * | 5/2007 | Kasukabe | G01R 1/0735 | |
| | | | 324/756.03 | |
| 2008/0100311 A1 * | 5/2008 | Freywald | G01B 7/06 | |
| | | | 324/716 | |
| 2011/0316576 A1 * | 12/2011 | Kataoka | G01R 31/2891 | |
| | | | 324/756.03 | |
| 2012/0194213 A1 * | 8/2012 | Komatsu | G01R 31/2887 | |
| | | | 324/756.03 | |

* cited by examiner

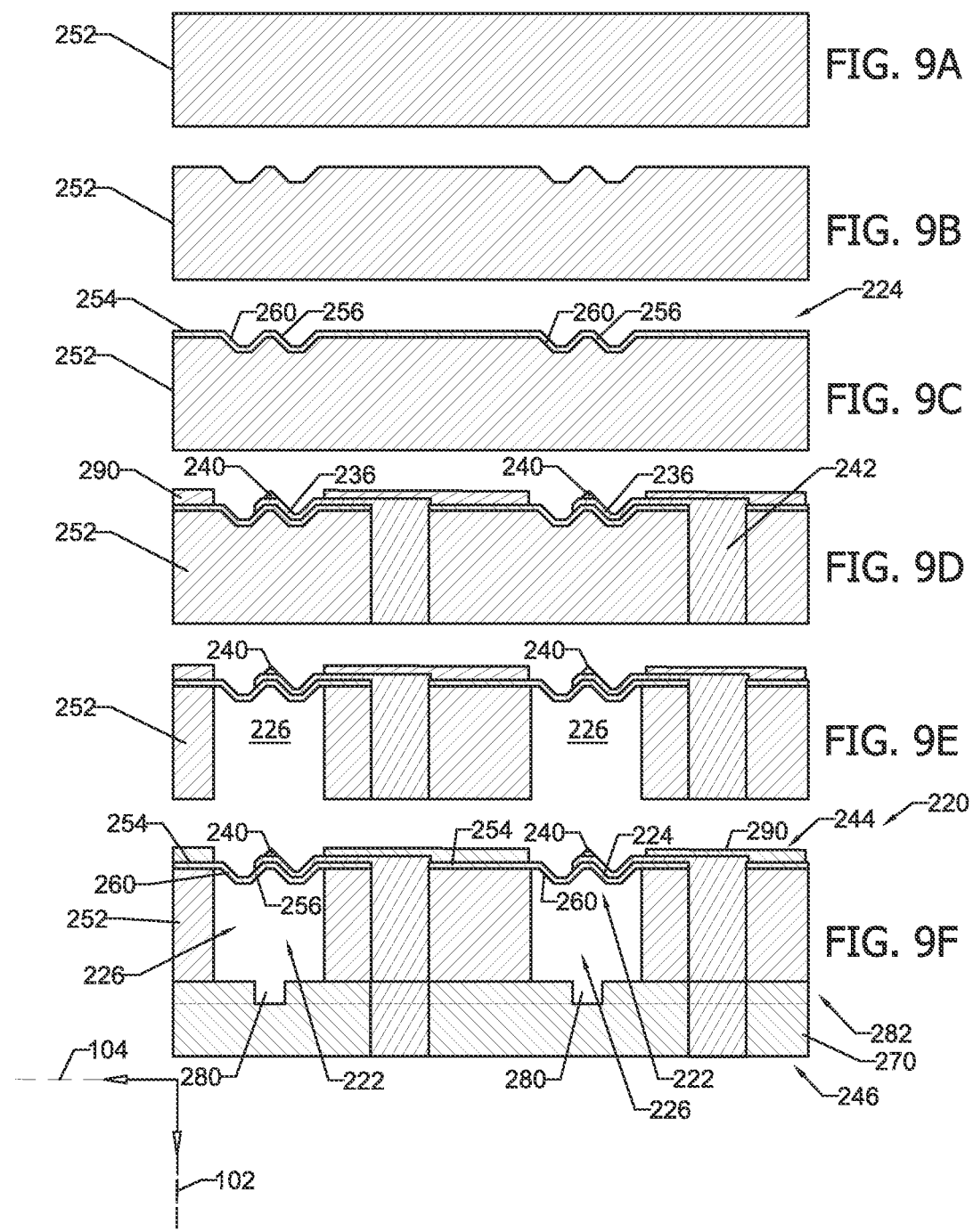

ND METHODS

FLUID PRESSURE ACTIVATED ELECTRICAL CONTACT DEVICES AND METHODS

CROSS-REFERENCE TO RELATED APPLICATION

This application claims the benefit of priority of U.S. provisional patent application No. 62/068,663, titled "Fluid Pressure Activated High Density Wafer Testing Probe Card" filed on Oct. 25, 2014, which is incorporated herein in its entirety by this reference. This application claims also the benefit of priority of U.S. provisional patent application No. 62/069,843, titled "Fluid Pressure Activated High Density Wafer Testing Probe Card and Test Socket," filed on Oct. 29, 2014, which is incorporated herein in its entirety by this reference. This application claims also the benefit of priority of U.S. provisional patent application No. 62/076,072, titled "Fluid Pressure Activated Wafer Level Probe Card/Burn-in/Test Socket Using Fluid Pressure as Source of Potential Energy for the Application and Control of the Desired Contact Force/Pressure," filed on Nov. 6, 2014, which is incorporated herein in its entirety by this reference.

TECHNICAL FIELD

The present disclosure relates generally to devices and methods for establishing electrical connections, and more particularly to fluid pressure activated device and methods for establishing electrical connections.

BACKGROUND

Electronic devices fabricated on semiconductor chips such as processors and logic devices are typically tested before being placed in consumer and commercial electronics devices. Many devices in the current marketplace contain a dozen or more semiconductor chip based devices, all of which should be tested before installation. Based on statistical data, twenty percent or more of the cost of semiconductor chips is related to the cost of testing.

As the world market sales for electronic devices reaches and surpasses hundreds of billions (USD), the costs of testing reaches and surpasses tens of billions. As consumers apply commodity pricing expectations to a growing list of established trusted brand names, the criticality of reliable and cost competitive testing equipment scales with the size of the market.

Before final assembly of an electronics consumer device in which hundreds and even thousands of microelectronics components are needed, each component may need to be tested. If even one single component is defective the device may be rendered useless. Semiconductor chips within such device are commonly made on substrate wafers having diameters of hundreds of millimeters. Thousands or even hundreds of thousands of electrical contact electrodes are typically present, and most or all of these contact electrodes needs to be tested or contacted to apply power and ground signals during the test. By current technology, as further described below, most or all of the contacts are to be touched and tested simultaneously. Given the small size and staggering number of contacts on a given wafer, the demands for precision and reliability placed on testing equipment is high.

SUMMARY

This Summary is provided to introduce in a simplified form concepts that are further described in the following detailed descriptions. This summary is not intended to identify key features or essential features of the claimed subject matter, nor is it to be construed as limiting the scope of the claimed subject matter.

According to at least one embodiment, a fluid pressure actuated device for establishing electrical contact includes: a substrate defining a chamber; a flexible membrane having a first side facing a first direction away from the substrate and a second side facing into the chamber in a second direction opposite the first direction; and an electrically conducting contactor mounted on the first side of the flexible membrane. The flexible membrane extends and withdraws moving the electrically conducting contactor in the first direction and second direction respectively when fluid pressure is increased and decreased in the chamber.

In at least one example, the flexible membrane has an undulating shape.

In at least one example, the flexible membrane includes at least one frustum portion.

In at least one example, the flexible membrane includes at least two concentric frustum portions that narrow in opposite directions.

In at least one example, the at least two concentric frustum portions include a central frustum portion and a second frustum portion that encircles the central frustum portion.

In at least one example, the central frustum portion narrows in the first direction and the second frustum portion narrows in the second direction.

In at least one example, the central frustum portion and second frustum portion at least partially overlap along a Z-axis defined as parallel to the first direction.

In at least one example, the substrate has a planar surface defining a normal that is parallel to the Z-axis.

In at least one example, the flexible membrane includes a central first cone portion and a second cone portion encircling the first cone portion, the first cone portion and second cone portion narrowing in opposite directions.

At least one example further includes an electrically conducting post in electrical communication with the electrically conducting contactor and extending in the second direction at least partially through the substrate.

At least one example further includes: a second flexible membrane having a first side facing the first direction and a second side facing the second direction into a second chamber defined by the substrate; and a second electrically conducting contactor mounted on the first side of the second flexible membrane, the first chamber and second chamber are in fluid communication through at least one channel defined by the substrate.

In at least one example, the first chamber and second chamber are maintained in pressure equilibrium by the at least one channel.

According to at least one embodiment, a fluid pressure actuated device for concurrently establishing multiple electrical contacts includes: a substrate defining multiple chambers interconnected by at least one channel; multiple flexible membranes, each having a first side facing a first direction away from the substrate and a second side facing into a respective one of the multiple chambers in a second direction opposite the first direction; and multiple electrically conducting contactors, each mounted on the first side of a respective one of the multiple flexible membranes; wherein the multiple flexible membranes extend and withdraw concurrently moving the multiple electrically conducting contactors in the first direction and second direction when fluid pressure is increased and decreased respectively in the multiple chambers.

In at least one example, each flexible membrane comprises at least one frustum portion.

In at least one example, each flexible membrane comprises at least two concentric frustum portions that narrow in opposite directions.

In at least one example, the at least two concentric frustum portions comprise a central frustum portion and a second frustum portion that encircles the central frustum portion.

In at least one example, the central frustum portion narrows in the first direction and the second frustum portion narrows in the second direction.

In at least one example, the multiple chambers are maintained in pressure equilibrium by at least one channel.

In at least one example, the device further includes: multiple second chambers defined by the substrate and interconnected by at least one second channel; multiple second flexible membranes, each having a first side facing the second direction away from the substrate and a second side facing into a respective one of the multiple second chambers in the first direction; and multiple second electrically conducting contactors, each mounted on the first side of a respective one of the multiple second flexible membranes; wherein the multiple second flexible membranes extend and withdraw concurrently moving the multiple second electrically conducting contactors in the second direction and first direction when fluid pressure is increased and decreased respectively in the multiple second chambers.

In at least one example, the multiple first chambers and multiple second chambers are maintained in pressure equilibrium by at least one connecting channel that directly or indirectly connects the first channel and second channel.

BRIEF DESCRIPTION OF THE DRAWINGS

The previous summary and the following detailed descriptions are to be read in view of the drawings, which illustrate particular exemplary embodiments and features as briefly described below. The summary and detailed descriptions, however, are not limited to only those embodiments and features explicitly illustrated.

FIG. 9A is a cross-sectional illustration of a substrate material layer prepared for manufacture of the device of FIG. 3 by a method represented in a sequence of cross-sectional views in FIGS. 9B-9F according to at least one embodiment.

FIG. 9B is a cross-sectional illustration of the substrate material layer FIG. 9A formed to have surface features upon which a membrane layer will be formed in FIG. 9C.

FIG. 9C is a cross-sectional view of the structure of FIG. 9B having a membrane layer formed across the surface features.

FIG. 9D is a cross-sectional illustration of the structure of FIG. 9C having electrically conducting traces and contactor tips selectively formed thereon.

FIG. 9E is a cross-sectional illustration of the structure of FIG. 9D having chambers 226 formed such as by etching or other hole formation method.

FIG. 9F is a cross-sectional illustration of the structure of FIG. 9E, joined to the substrate layer of FIG. 5 to complete fabrication of the device 300 of FIG. 3 according to at least one embodiment.

DETAILED DESCRIPTIONS

Figure 1:
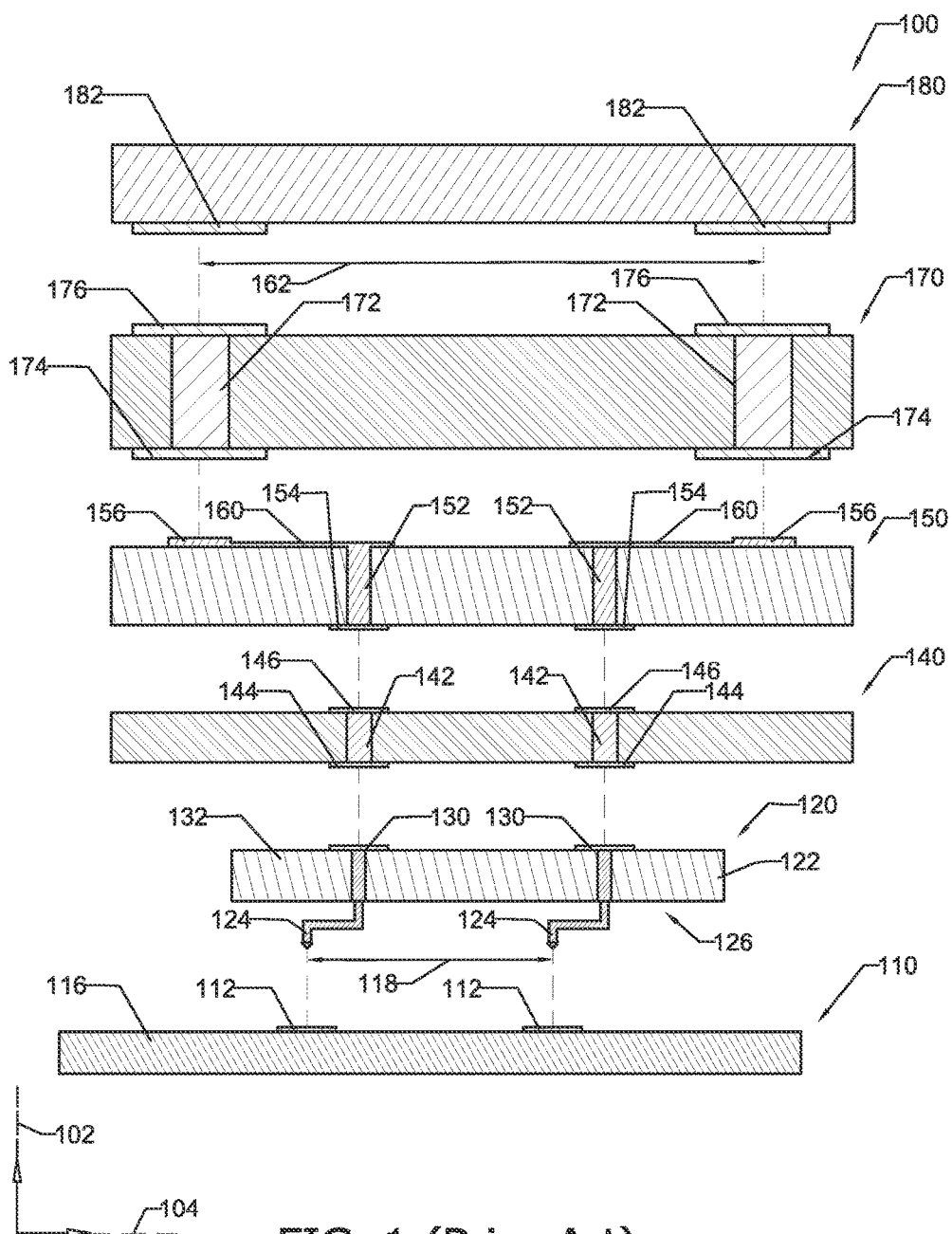
FIG. 1 is a cross-sectional illustration of a testing arrangement in which a semiconductor device having electrical contacts is tested using a probe card of the prior art.

These descriptions are presented with sufficient details to provide an understanding of one or more particular embodiments of broader inventive subject matters. These descriptions expound upon and exemplify particular features of those particular embodiments without limiting the inventive subject matters to the explicitly described embodiments and features. Considerations in view of these descriptions will likely give rise to additional and similar embodiments and features without departing from the scope of the inventive subject matters. Although the term "step" may be expressly used or implied relating to features of processes or methods, no implication is made of any particular order or sequence among such expressed or implied steps unless an order or sequence is explicitly stated. Any dimensions expressed or implied in the drawings and these descriptions are provided for exemplary purposes. Thus, not all embodiments within the scope of the drawings and these descriptions are made according to such exemplary dimensions. The drawings are not made necessarily to scale. Thus, not all embodiments within the scope of the drawings and these descriptions are made according to the apparent scale of the drawings with regard to relative dimensions in the drawings. However, for each drawing, at least one embodiment is made according to the apparent relative scale of the drawing. Like reference numbers used throughout the drawings depict like or similar elements.

FIG. 1 is a cross-sectional illustration of a testing arrangement 100 in which a semiconductor device 110 having electrical contacts 112 is tested using a probe card contactor 120 of the prior art. The probe card 120 includes a board 122 that would ideally be planar and rigid, however these expectations are not reliably or sustainably met in the prior art. Probe tips 124 extend from one surface 126 of the board, and corresponding electrically conducting contacts 130 are placed along the opposite surface 132, each contact 130 in electrical contact with a respective probe tip 124. For convenience, these descriptions refer to the surface 126 as a lower surface and to the opposite surface 132 as an upper surface.

References to elements such as upper and lower surfaces are made in these descriptions with respect to the illustrated orientations of structures and features in the drawings. Features such as planar surfaces described as facing up or down and probe tips as extending up or down are not limited in fabrication, testing, or use to any absolute vertical or other orientation.

Figure 2:
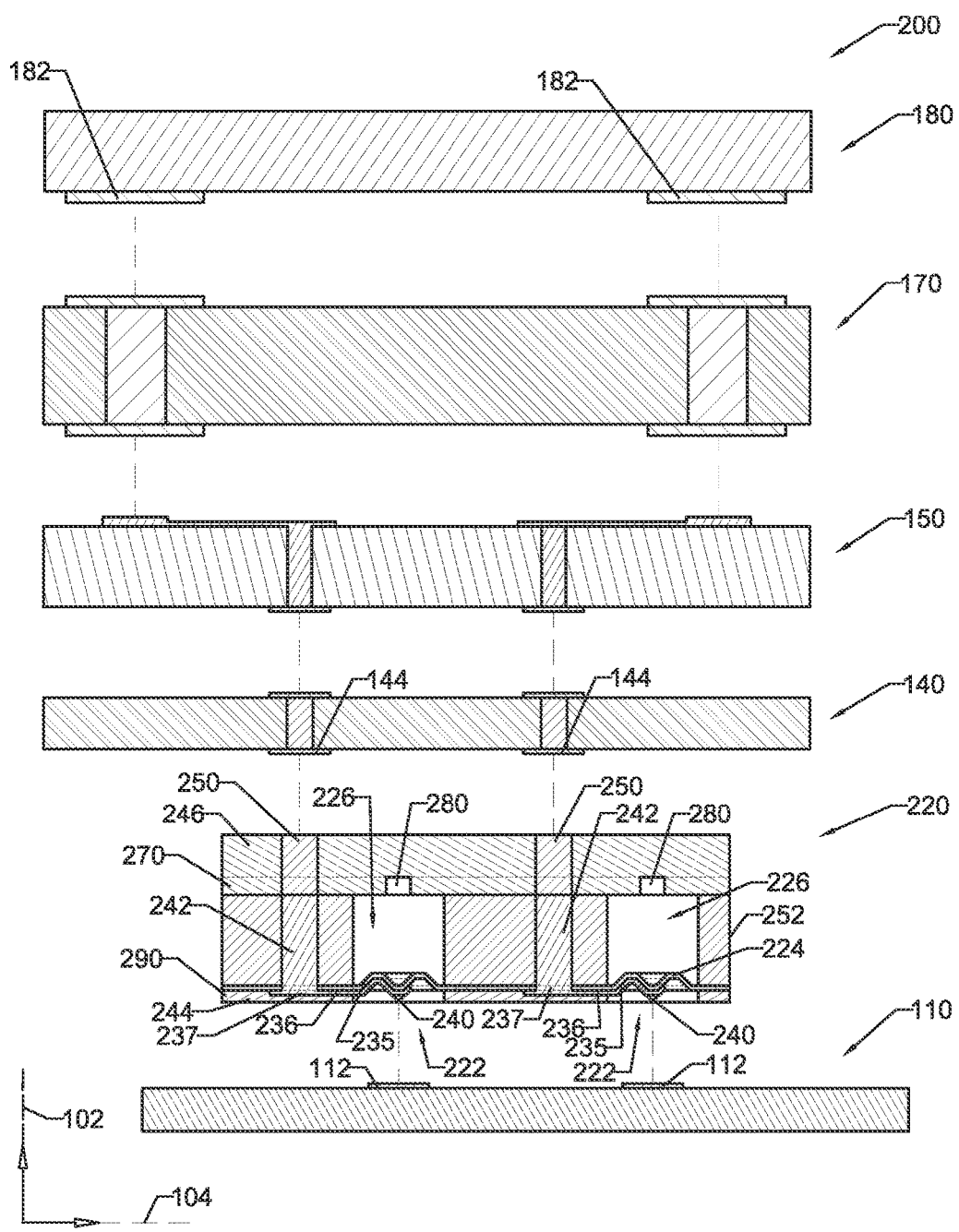
FIG. 2 is a cross-sectional illustration of a testing arrangement in which a semiconductor device having electrical contacts is tested using a probe card device having fluid-pressure driven actuators according to at least one embodiment of the invention.

Furthermore, with reference to the planar upper surface 116 of the semiconductor device 110, an axis normal to the surface 116 can be described for nominal purposes as the Z-axis 102, whereas axes and directions perpendicular to the normal of the surface 116 can be described as having only X-axis 104 and Y-axis components. In FIGS. 1 and 2, the Y-axis should be considered as extending into the page of the drawings, such that the expressly shown Z-axis 102, the expressly shown X-axis 104 and the inferred Y-axis constitute a set of mutually orthogonal axes upon which convenient spatial descriptions are based in the following.

The testing arrangement 100 includes a first joining mechanism 140 having a board through which electrically conducting posts 142 pass to electrically connect electrically conducting lower contacts 144 to corresponding electrically conducting upper contacts 146.

The testing arrangement 100 further includes a spatial transformer 150 having a board through which electrically conducting posts 152 pass to electrically connect electrically conducting lower contacts 154 to corresponding electrically conducting upper contacts 156 via electrically conducting spreader strips 160. The spreader strips 160 effectively increase the pitch for electrical contact. Pitch in this context refers to the distance between contacts. For example, the pitch 118 of the contacts 112 along the upper surface 116 of the semiconductor device 110 in some examples may be below one hundred micrometers, whereas the pitch 162 of the upper contacts 156 of the spatial transformer 150 is larger by the amount of spread along the X-axis 104 introduced by the spreader strips 160. The space transformation may be realied through multiple layers of spreaders 160. An advanced space transformer may consist of tens of layers of routing.

The testing arrangement 100 further includes a second joining mechanism 170 having a board through which electrically conducting posts 172 pass to electrically connect electrically conducting lower contacts 174 to corresponding electrically conducting upper contacts 176.

A device known as a device under test (DUT) board 180 having electrically conducting lower contacts 182 is brought into electrical communication with the semiconductor device 110 through the probe card 120, first joining mechanism 140, spatial transformer 150 and second joining mechanism 170, in succession, when the adjacent elements in FIG. 1 are brought into contact. Electrical voltages and currents are conveyed from the DUT board 180 to the semiconductor device 110 and the responsive performance of the device 110 is measured.

While only two routes of connection are expressly illustrated in FIG. 1, these descriptions relate to any number of routes of connection. For example, the semiconductor device 110 can have a large number electrical contacts 112 arranged in any preferred array pattern, such as a rectangular grid pattern having regularly spaced rows and columns. While a single spatial transformer 150 is illustrated as introducing spatial spreading along the X-axis 104, these descriptions relate to arrangements in which one or more spatial transformers introduce spatial spreading along both the X-axis 104 and Y-axis. Any number of joining mechanisms is within the scope of these descriptions as well. Ultimately, the components of the testing arrangement intervening between the semiconductor device 110 and DUT board 180 are to effect the transformation of the pitch of the semiconductor device 110 contacts 112 in each of two dimensions, X-axis pitch and Y-pitch, to the DUT board 180 contacts 182, so that each contact 112 is ultimately brought into electrical communication with a corresponding contact 182, in one-to-one correspondence.

A key component in the intervening components of the testing arrangement 100, and one prone to failure, is the probe card 120 of the prior art shown in FIG. 1. The integrity and durability of the probe card 120 rely upon the resiliency of the probe tips 124. The probe tips 124 each flex to some degree as a large number of probe tips are brought into contact with corresponding electrical contacts 112 for testing of the semiconductor device 110 by the DUT board 180. Force is applied by each probe tip 124 upon contact according to its flexure and effective spring constant of its material and shape. While a uniform contact force is preferred for consistent testing standards across an array of contacts 112, even where a high degree of uniformity upon manufacture of the probe tips 124 is achieved, repeated use can cause wear and fatigue in a non-uniform manner across an array of probe tips. For example, the board 122 of the probe card 120 can lose its planar configuration, especially when subjected to a high number of testing sessions, which often include thermal cycling. Whether causing uneven wear across an array, or even causing some probe tips 124 to fail to make contact, warping of the board 122 can cause failure of the probe card. But even before a probe card 120 is put into use, many are rejected from use due to low yield of probe cards having sufficiently low Z-axis tolerance. Thus, the probe cards 120 of the prior art are manufactured with low yield and high cost and suffer limited useful lifetimes.

FIG. 2 is a cross-sectional illustration of a testing arrangement 200 in which the semiconductor device 110 having electrical contacts 112 is tested using a probe card contactor 220 according to at least one embodiment among several expressly described in detail in the following, and among many more embodiments suggested and implied by the full scope of these descriptions and the drawings in FIGS. 2-15. Elements having like reference numbers in FIG. 2 as those elements in FIG. 1 are already sufficiently described above.

In FIG. 2, the probe card contactor 220 has fluid-pressure driven probe actuators 222, each having a flexible membrane 224 that responds to fluid pressure directed into a chamber 226 formed in a planar substrate body. The membrane 224 has a first surface internally facing into the chamber 226 and a second surface externally facing outward, such that the internal surface and external surface generally face in opposite Z-axis directions. An electrically conducting trace 236 extending at least partially across the external surface is carried by movement of the membrane 224 by the control of fluid pressure directed into the chamber 226. An electrically conducting contactor tip 240 mounted upon the external side of the trace 236 has a distal end that extends outward from the probe actuator 222 to contact an electrical contact 112 of the semiconductor device 110 under testing. The trace 236 extends from the tip 240 and along the external surface of the membrane 224 to an electrically conducting post 242. The trace 236 has a flexible portion 235 over the membrane 224 and a portion 237 over the substrate surface. The portion 237 may not always be defined as flexible, especially if formed over a rigid silicon surface.

The post 242 extends along a Z-axis direction through the substrate body of the probe card contactor 220, generally from a probe card first side 244 to a probe card second side 246 that face generally in opposite Z-axis 102 directions. The conducting post 242 has a first end contacted by the trace 236 and a second end defining a contact 250 at the second side 246 of the probe card contactor 220. Thus, the conducting post 242 and trace 236 serve to bring the contactor tip 240 into electrical communication with a corresponding lower contact 144 of the joining mechanism 140 in the testing arrangement 200 of FIG. 2. In other testing and electrical communication arrangements, the tips 240 can be brought into electrical communication with other joining mechanisms, spatial transformers and other devices to convey electrical voltages and currents from the DUT board 180 to the semiconductor device 110 to test and measure the responsive performance of the device 110. Indeed, the device 220 can be applied in broad range of controllable electrical contact uses.

For control and actuation of each fluid-pressure driven probe actuator 222, a microfluidic channel 280 opens into the chamber 226 for the provision of fluid pressure into the chamber to control the Z-axis position of membrane 224 and contactor tip 240. Applying or increasing pressure within the chamber 226 bears force upon the internal surface of the membrane causing outward Z-axis extension movement of the membrane and tip to establish physical contact and electrical communication with a contact 112 of the semiconductor device 110 or other structure or device. Cessation or decreasing pressure within the chamber 226 ends or lessens force upon the internal surface causing inward Z-axis return or withdrawal movement of the membrane 224 and tip 240 to terminate physical contact and electrical communication.

Contact force of the tip 240 upon the contact 112 of the semiconductor device 110 or other structure or device is controlled by regulating the amount of pressure within the chamber 226. Greater Z axis extension may not equal greater force. When the pressure is slightly above the atmospheric pressure, at certain point all the contact will start touching the wafers electrode pads. Further increasing the fluid pressure then increases the force between contactor tips and wafer electrode pads, since there is not any space for Z-axis to move anymore, therefore once the contactor touches decreasing or increasing pressure does not increase or Decrease the Z-axis movement. Depending on the material and thickness of the membrane, membrane slack and conductive traces material, spring constant thickness and shape, a certain minimum pressure may cause all the contactors to reach their maximum height. When the wafer surface is pressed toward the contactor substrate surface and pressure is increased the increasing pressure only brings the contactors from contactor substrate into contact with wafer electrode pads, once all the contactor tips touch the wafer electrode pads, increasing pressure does not increase the Z-axis displacement anymore, it only increases electrical contact force. The goal may not be to bring in contact all the electrodes well within the contactors movement range. For example if the movement range is 20 microns, it may be preferred for the contactors to touch the wafer electrode pads somewhere around 10 microns displacement. From here on the Z axis displacement is restricted by the wafer electrode pads, and further increase in pressure will only translate to contact force increase.

Figure 3:
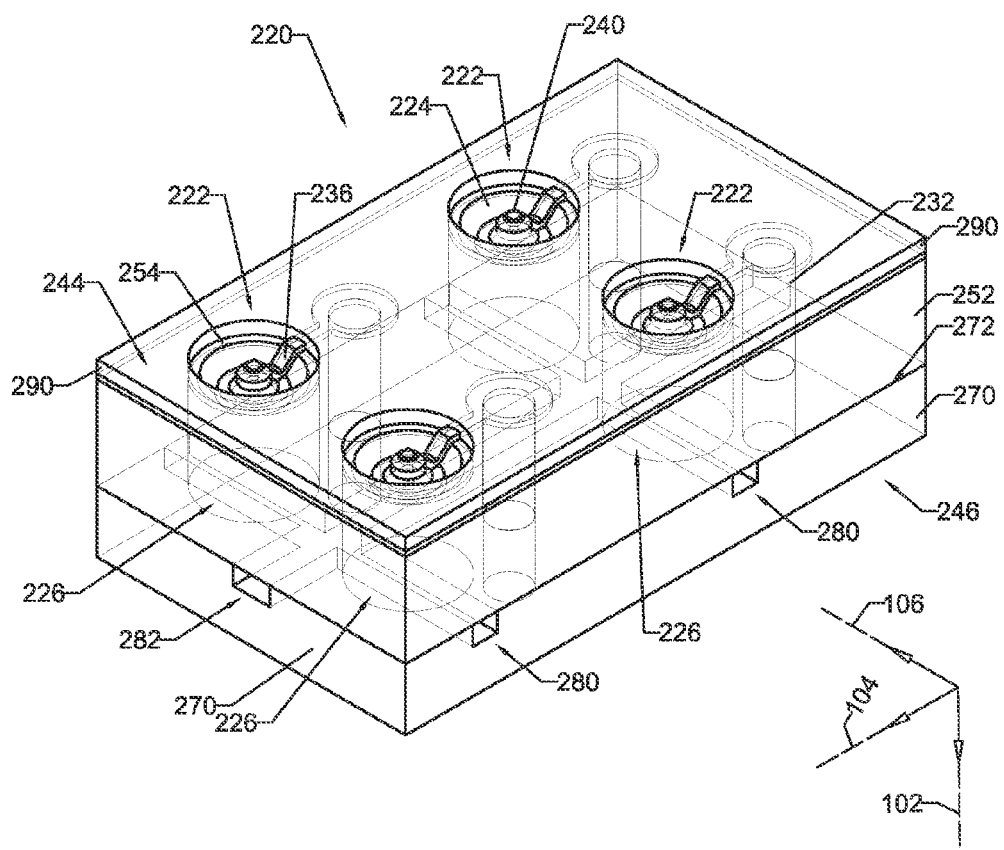
FIG. 3 is a perspective view of the probe card device of FIG. 2, illustrating the internal layout of microfluidic channels for control of the actuators.
Figure 4:
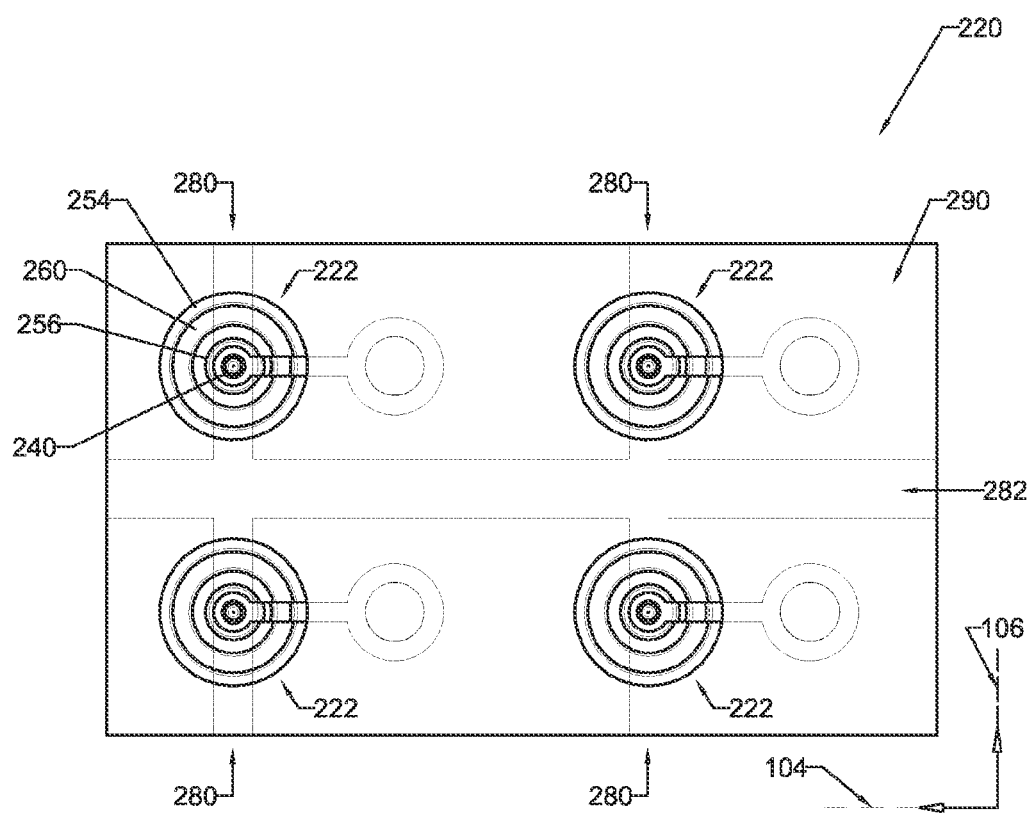
FIG. 4 is a plan view of the device of FIG. 3.

FIG. 3 is a perspective view of the probe card contactor 220 illustrating the layout of microfluidic channels for control of the fluid-pressure driven probe actuators 222 of the probe card contactor 220 of FIG. 2. FIG. 4 is a plan view taken along the Z-axis of the probe card of FIG. 2. In the illustrated embodiment, the channels 280 that open into the chambers 226 extend in Y-axis 106 directions and perpendicularly intersect microfluidic channels 282 that extend in X-axis 104 directions. As such, the channels 280 and 282 crisscross the probe card contactor 220 to distribute fluid pressure to every probe actuator 222. In the illustrated embodiment of the probe card contactor 220, the channels 280 and 282 are co-located at a Z-axis depth within the probe card contactor 220 intermediate the probe card first side 244 to a probe card second side 246, placing the channels 280 into fluid communication with the chambers 226 of the actuators 222.

FIGS. 2-3 illustrate the layered structure of the probe card contactor 220. FIG. 9F provides a similar, but enlarged, view of the probe card contactor 220 as that in FIG. 2. As shown, the chambers 226 are formed as or defined by through-holes in a first substrate layer 252 of the substrate body. Each chamber 226 in the illustrated embodiment is formed as a circular cylindrical hole extending parallel to the Z-axis 102, normal to the generally planar probe card first side 244 and opposite probe card second side 246. Other shapes (see FIGS. 13A-13B for example) are within the scope of these descriptions.

Each flexible membrane 224 has generally planar marginal regions 254 (FIG. 9C, 9F) surrounding the mouth of the corresponding chamber 226 and attached to the first side 244 facing surface of the first substrate layer 252. The membrane 224 furthermore extends and covers the mouth of the chamber 226, sealing the chamber 226 at the first side 244 facing end of the chamber. The membrane 224 is advantageously formed as having a waving or undulating shape in crossing the mouth of the chamber 226. This provides a greater range of motion of the contactor tip 240 than would likely be possible with a simple planar membrane stretched across the mouth of the chamber. The membrane 224 has a central frustum portion 256 having its tapering apex or narrowing end extending outward from the chamber 226.

Between and connecting the central frustum portion 256 and planar marginal region 254, the membrane 224 has an intermediate frustum portion 260 that is concentric with and circumferentially encircles or surrounds the central frustum portion 256. The intermediate frustum portion 260 has a tapering narrowing end extending inward toward the chamber 226. The central frustum portion 256 and intermediate frustum portion 260 at least partially overlap along the Z-axis such that the central frustum portion 256 is at least partially nested within the intermediate frustum portion 260.

As such, the waving or undulating shape of the membrane 224 in crossing the mouth of the chamber 226 provides a higher total material area than would a simple planar membrane stretched across the mouth. Thus by flexure, stretching and other distortions of the concentrically arranged planar marginal region 254, intermediate frustum portion 260 and central frustum portion 256, a greater range of Z-axis motion of the contactor tip 240 is facilitated than would likely be possible with a simple planar membrane stretched across the mouth of the chamber.

In the illustrated embodiment, the flexible portion 235 of the electrically conducting trace 236 follows the waving or undulating shape of the external surface of the membrane 224, and flexes, stretches and distorts with the membrane 224. The conducting trace 236 extends from the conducting post 232 to the central cone or partial cone 256, where the contactor tip 240 is mounted.

Figure 13A:
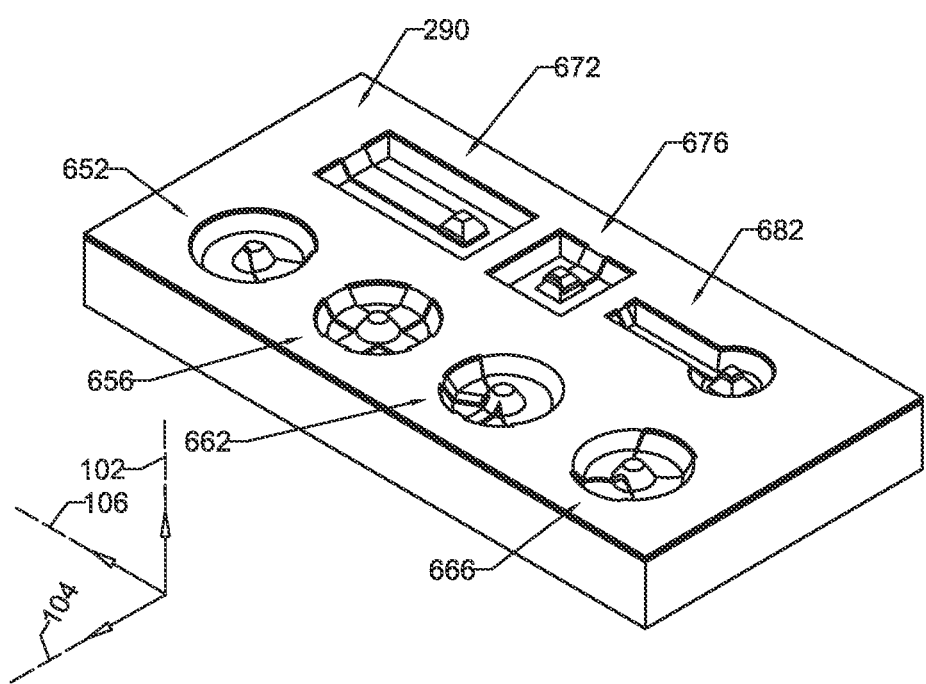
FIG. 13A is a perspective view of several embodiments of fluid-pressure driven probe actuators formed as various shapes.
Figure 13B:
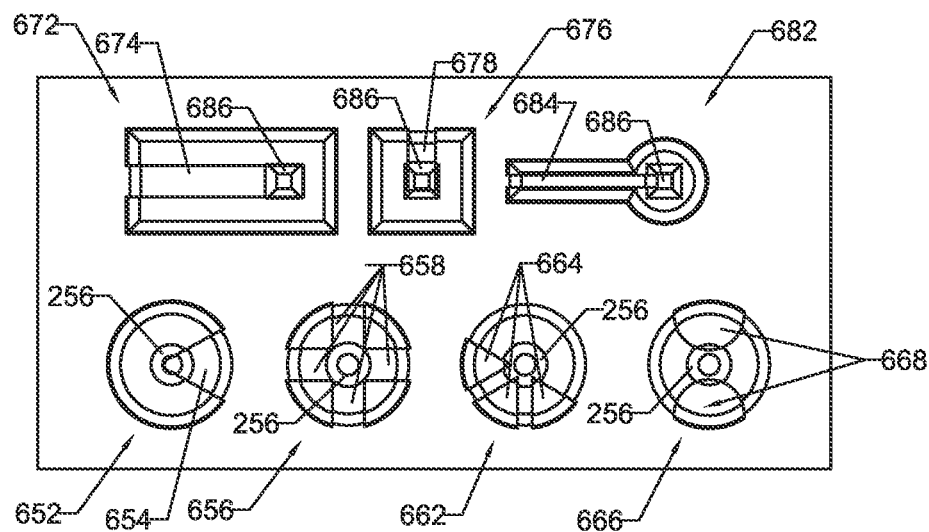
FIG. 13B is a plan view of the several embodiments of fluid-pressure driven probe actuators in FIG. 13A.

In the embodiment illustrated in FIGS. 2-4, the membrane 224 has the concentric frustum portions 256 and 260, which narrow in opposite Z-axis directions, and which are formed as circular cone portions having circular footprints when viewed along the Z-axis 102 as in FIG. 4. The central frustum portion 256 may include an entire cone, including an apex, or may be a truncated cone. In other embodiments, the frustum portions 256 and 260 may be pyramid shaped, having polygonal footprints such as square or rectangular when viewed along the Z-axis as shown in FIGS. 13A-B for example. In other embodiments, the central portions of the membranes and intermediate portions, which connect the central portions to the marginal regions, are other shapes that narrow in opposite Z-axis directions, thus defining a waving or undulating shape of each membrane.

Figure 5:
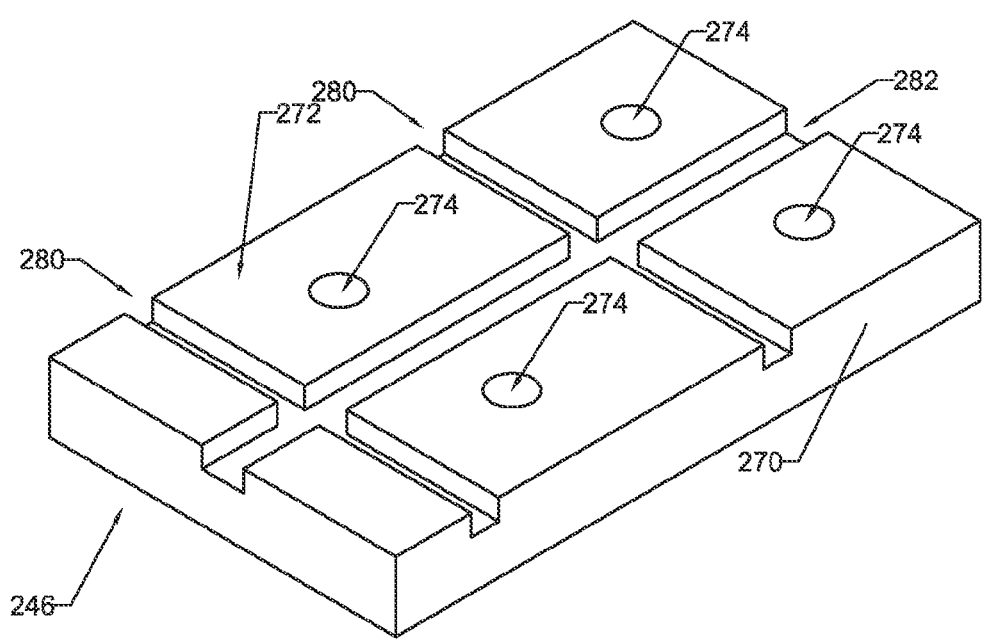
FIG. 5 is a perspective view of a substrate layer of the device of FIG. 3, in which the microfluidic channels are formed.

FIG. 5 is a perspective view of a second substrate layer 270 of the probe card contactor 220 of FIGS. 2 and 3, in which the channels 280 and 282 are formed. The second substrate layer 270 has a first surface 272 (FIG. 3), which faces the first substrate layer 252 (FIG. 3) and in which the channels 280 and 282 are formed. The opposite surface of the second substrate layer 270 defines the second side 246 of the probe card contactor 220, facing an opposite Z-axis direction from that in which the contactor tips 240 face. Through holes 274 extend at least partially parallel to the Z-axis 102 to accommodate the electrically conducting posts 242.

As shown in FIGS. 2 and 3, the outward facing surface of an electrically insulating protective passivation or cover layer 290 defines the first side 244 of the probe card contactor 220. The illustrated cover layer 290 lies over the generally planar marginal regions 254 of the membranes 224, the traces 236 beyond the chamber mouths, and the outward facing surface of the first substrate layer 252. Holes are formed through the cover layer 290 to provide openings at positions corresponding to the concentric locations of the chambers 226 and frustum portions 256 and 260 of the membranes 224 to permit electrical contact of the contactor tips 240 through the cover layer 290.

The cover layer 290 in the illustrated embodiment is sufficiently thick in its Z-axis dimension to provide a first side 244 of the probe card contactor 220 flush with the distal ends of the contactor tips 240. In other embodiments, the cover layer thickness can be selected to cause the contactor tips 240 to extend from the first side 244. In yet other embodiments, the cover layer thickness can be selected to cause the contactor tips 240 to terminate at or below the first side 244 to prevent contact with external surfaces until the membrane 224 is extended by fluid pressure.

The membrane 224 (FIGS. 2-3) can be constructed of one or more flexible and resilient materials including both electrically conducting and non-conducting materials. In many embodiments, each contactor tip 240 and trace 236 are to be electrically isolated from the others while being electrically connected to a corresponding conducting post 142, thereby permitting electrical contact of a respective individual electrical contact of a device via a particular individual fluid-pressure driven probe actuator 222. In one example construction, the membrane 224 is constructed of Parylene, and the trace 236 and contactor tip 240 are formed of electrically conducting metal or alloy. Graphene, having advantageous strength and being highly electrically conductive, may be used in the construction of the membrane 224. Graphene can be used as a layer or trace upon a Parylene layer. In such an example, the Parylene electrically isolates the graphene from unwanted shorting or mutual connection among traces. The membrane 224 can be a composite or layered membrane. For example, a first layer adjacent the first substrate layer 252 can be Parylene, with a graphene layer upon the first layer to strengthen the membrane. In that example, any number of conducting or non-conducting layers can be added, so long as the top layer of the membrane is electrically non-conducting to permit independent electrical connection of each contactor tip 240 and corresponding trace 236 to a unique corresponding conducting post 142. Other conducting metals for use in or on the membrane 224 include, but are not limited to, nickel and copper. The entire membrane could consist of conducting material, where electrical signals isolation is provided in the form on isolation rings or gaps around each membrane member. For example mono layers of Graphene sandwiched between multiple very thin layers of conductive material (metals), where electrical conductivity and flexibility is maintained, while the strength of the conductive membrane is kept by its composite multilayer nature. Mono layer Graphene is very flexible, but imperfections make a mono layer graphene prone to breakage. Also a mono layer of graphene may not provide enough conductivity, while multiple layers of graphene on top of each other diminishes flexibility. The membrane material can also be Graphene oxide and other composite membrane type. A benefit is to marginalize the role of spring constant and rather rely on the fluidic pressure to apply contact force. A very flexible membrane and metal trace, with zero spring constant is used in at least one embodiment.

As shown in FIG. 3, the microfluidic channels 280 and 282 extend in Y-axis 106 and X-axis 104 directions to lateral margins of the probe card contactor 220. FIG. 3 expressly illustrates four fluid-pressure driven probe actuators 222 but relates as well to a probe card having any number of actuators 222 and any corresponding dimensions along the X and Y axes. The channels 280 and 282 are configured to receive pressured fluid from an external fluid source to actuate any number of actuators 222. The fluid driven into the inlets of the channels 280 and 282 may be gaseous or liquid in various embodiments. The fluid in at least one embodiment is air. The fluid in other embodiments of gaseous fluids can be other gases. The fluid in at least one embodiment is water, and in other embodiments of liquid fluids can be other liquids. The fluid can be gas, liquid, and any material or phase thereof to apply hydrostatic pressure. Forces applied by fluid pressure to the membranes 224 may be uniform across the probe card contactor 220, according to Pascal's law, by way of the intersecting channels 280 and 282 that maintain the chambers 226 in pressure equilibrium. Some channels or all channels may be isolated from some or all other channels in case the device is used as a switching or multiplexing device, where as the pressure underneath a membrane is lower than the pressure above a membrane, will cause the electrical contact to terminate by collapsing the membrane below the surface.

Using the testing arrangement 100 of FIG. 1, when the probe card 120 of the prior art and semiconductor device 110 are brought together, the total mechanical contact force is as same as the total electrical contact force, and are thus not separately controlled. Variations from buckling or material fatigue result in random variations of contact force across the many electrical contacts 112 that are typically under testing. This can lead to damage of the contacts 112 and probe tips 124 as well.

Using the testing arrangement 200 of FIG. 2, when the probe card contactor 220 and semiconductor device 110 are brought together, the cover layer 290 can first contact the upper surface of the semiconductor device 110 before the fluid-pressure driven probe actuators 222 are actuated. Once mechanical contact of the probe card contactor 220 and semiconductor device 110 is accomplished, fluid pressure within the chambers 226 can be increased by injecting fluid into the microfluidic channels 280 and 282, thus causing the membranes 224 to extend and the distal ends of the contactor tips 240 to contact the contacts 112. The forces of contact across many contactor tips 240 and contacts 112, governed by Pascal's law which dictates pressure equilibration among the interconnected chambers 226, are both uniform and controllable.

Figure 6:
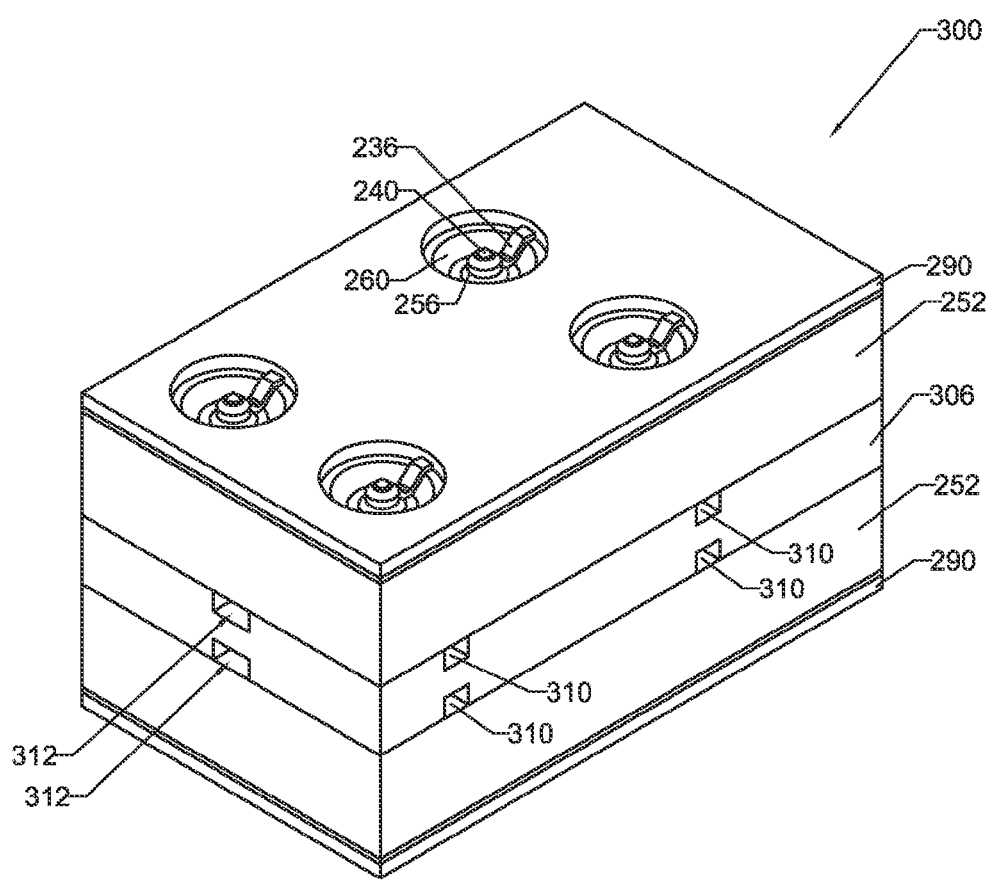
FIG. 6 is a perspective view of a double-sided device, according to at least one embodiment, having fluid-driven actuators along opposing upper and lower generally planar sides.
Figure 7:
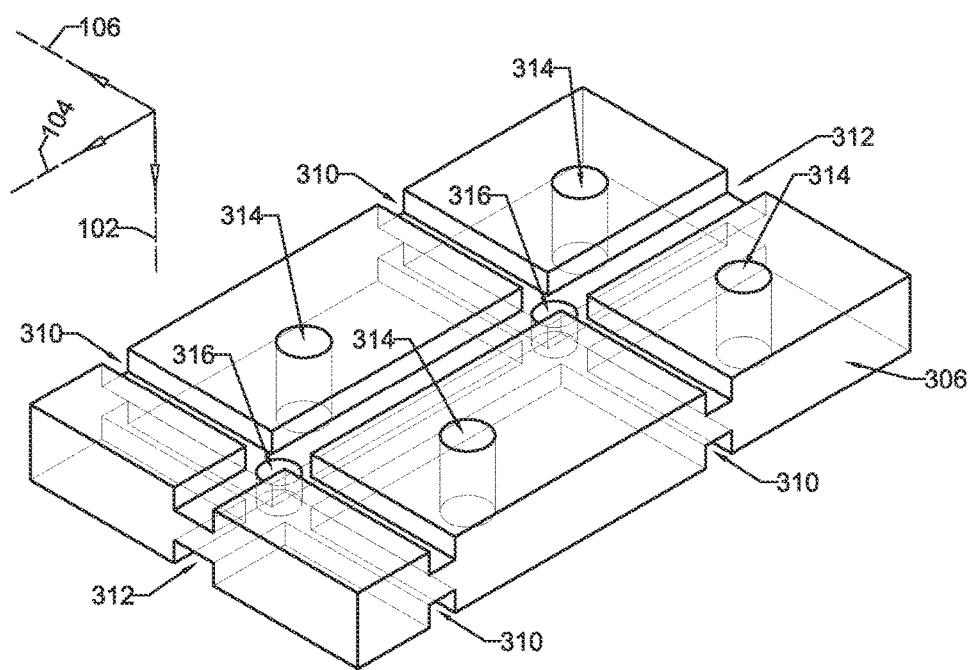
FIG. 7 is a perspective view of a central substrate layer of the device of FIG. 6.
Figure 8:
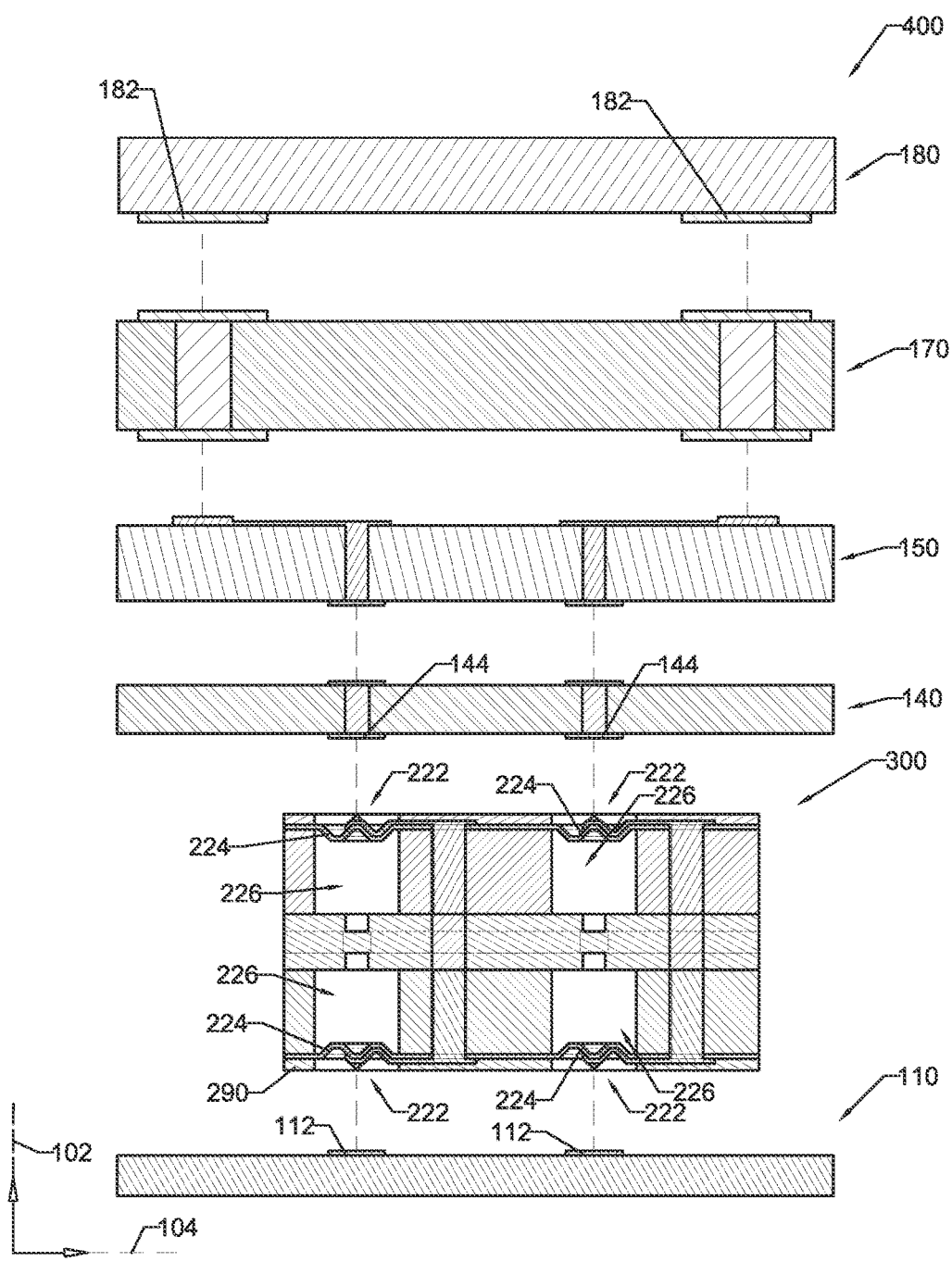
FIG. 8 is a cross-sectional illustration of a testing arrangement in which a semiconductor device having electrical contacts is tested using the device of FIG. 6.

The above descriptions with reference to FIGS. 2-5 relate to a fluid driven actuatable electrical contact device 220 thus far described as a probe card. It should be understood that these descriptions relate to other uses for an electrical contact device controlled to extend electrical contacts by driving pressured fluid into channel inlets. Furthermore, the above descriptions expressly describe a device 220 having fluid-driven actuators 222 along one generally planar side 244. FIGS. 6-8 relate to a fluid driven actuatable electrical contact device 300 having fluid-driven actuators 222 along two generally planar sides 302 and 304.

FIG. 6 is a perspective view of a double-sided device 300 having fluid-driven actuators along opposing upper and lower generally planar sides according to at least one embodiment. The device 300 has a sufficient degree of symmetry above and below the substrate layer 306 such that description of the device 300 above the layer 306 suffices for a complete description. The central substrate layer 306 differs from the second substrate layer 270 of FIG. 5, for example in that the layer 306 has microfluidic channels formed along upper and lower surfaces and Z-axis extending through holes to effect fluid communication among the upper and lower channels.

FIG. 7 is a perspective view of the central substrate layer (micro fluidic channels substrate) 306 of the probe card 300 of FIG. 6. Above the central plane of the central substrate layer 306, microfluidic channels 310 and 312 crisscross an upper surface of the layer 306 parallel to the Y-axis 106 and X-axis 104 respectively. Through holes 314 extend along the Z-axis 102 to accommodate electrically conducting posts 242 as shown in FIG. 8. Through holes 316 formed at intersections of the channels 310 and 312 effect fluid communication between the microfluidic channels along the upper and lower surfaces of the layer 306. They don't need to be necessarily at the intersections. It is also possible to have only channels along the Y axis or only along the X axis. Thus, by way of the through holes 316 that extend at least partially parallel to the Z-axis 102, the fluid-driven actuators 222 along the upper and lower sides of the double-sided probe card 300 are actuated simultaneously by fluid pressure driven into inlets of the microfluidic channels 310 and 312. For switching applications, the bottom and top cavity chambers may be driven by separate valves and/or separate pressure sources, in order to terminate some electrical connections and activate some. Instead of microfluidic channels, a porous ceramic substrate material 306 could be used.

The fluid-driven actuators 222 having flexible membranes 224 that respond to fluid pressure directed into the chambers 226 are described above with reference to FIGS. 2-4. Elements in FIGS. 6-8 having reference numbers the same as elements in FIGS. 1-5 are already described above.

FIG. 8 is a cross-sectional illustration of a testing arrangement 400 in which the semiconductor device 110 having electrical contacts 112 is tested using the probe card 300 of FIG. 6. In the testing arrangement 400 of FIG. 8, the double-sided probe card 300 is positioned between the semiconductor device 110 and first joining mechanism 140. Once the lower cover layer 290 of the probe card 300 mechanically contacts the semiconductor device 110, and mechanical contact of the upper cover layer 290 to the first joining mechanism 140 is also established, fluid pressure within the chambers 226 of the probe card can be increased, thus causing extension of the lower membranes 224 toward the semiconductor device 100 and extension of the upper membranes 224 toward the first joining mechanism 140. Because the upper and lower membranes 224 extend in opposite Z-axis 102 directions, the effective actuating reach of the double-sided probe card 300 is advantageously maximized. The joining mechanism 140 can be eliminated in this configuration, since 300 is may act sufficiently as a temporary joining mechanism. In at least one embodiment, use of a double sided contactor eliminates the need for a permanent joining mechanism. Though in certain cases it could help the permanent joining process, such as eutectic, gold to gold or diffusion bonding.

Like the device 200, the expressly described use of the device 300 permits reference to the device as a probe card 300. It should be understood that both the device 200 and the device 300 are not limited to uses as probe cards in the context of FIGS. 2 and 8, which illustrate non-limiting examples of uses for the devices described herein having many possible other uses.

A method of manufacturing the device 300 (FIGS. 2-4, 9F) according to at least one embodiment, is represented in a sequence of cross-sectional views in FIGS. 9A-9F. All materials and treatment methods are provided as non-limiting examples. Other materials and methods are within the scope of these descriptions.

FIG. 9A is a cross-sectional illustration of substrate material layer 252. Example materials include, but are not limited to: silicon, glass, copper, polyimide, and other electronics materials.

FIG. 9B is a cross-sectional view of the substrate material layer 252 of FIG. 9A formed to have surface features upon which membranes 224 will be formed. Methods of forming the features include, but are not limited, to using: chemical etch; stamping; mechanical forming; plasma/RIE etching; and plating.

FIG. 9C is a cross-sectional view of the structure of FIG. 9B having the membrane 224 formed across the surface features, forming the planar marginal region 254, intermediate frustum portions 260 and central frustum portions 256 of the membrane. Example membrane materials include, but are not limited to: Parylene, polyimide, SiN, graphene, and graphene oxide. Additional descriptions of the membrane 224 are provided above with reference to FIGS. 2 and 3. The membrane material can be a monolithic later or a combination of different materials. The order of layers can be changed and different materials can be used to increase the flexibility and flexural and mechanical strength of the membrane material.

FIG. 9D is a cross-sectional view of the structure of FIG. 9C having the electrically conducting trace 236 and contactor tip 240 layers selectively formed. The traces 236 are formed of flexible conducting material, whereas the tips 240 may be formed of harder conductive metals or conductive carbon fibers. The trace 236 and contactor tip 240 layers may be applied in a variety of ways including, but not limited to: plating; CVD; PCVD; and sputtering. FIG. 9D also shows the passivation cover layer 290 formed on the structure.

FIG. 9E is a cross-sectional view of the structure of FIG. 9D having chambers 226 formed such as by etching or other hole formation method.

FIG. 9F is a cross-sectional view of the structure of FIG. 9E, joined to the second substrate layer 270 (FIG. 5) having microfluidic channels to complete fabrication of the device 220 (FIGS. 2-4) according to at least one embodiment.

Additional and intermediate processes and steps may be involved to achieve the structures shown in FIGS. 9A-9F. Such processes and steps may include, photo resist steps, application exposure steps, development, stripping, chemical etching, masking, plasma etching, and others.

A method of manufacturing an alternative device 500 (FIG. 10F) according to at least one embodiment, is represented in a sequence of cross-sectional views in FIGS. 10A-10F. All materials and treatment methods are provided as non-limiting examples. Other materials and methods are within the scope of these descriptions. Like reference numbers in FIGS. 10A-10F as in other drawings refer to like features.

Figure 10A:
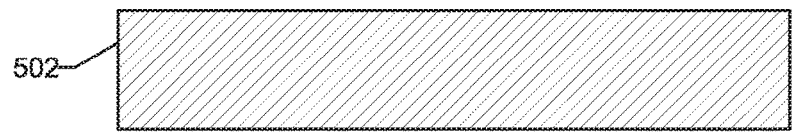
FIG. 10A is a cross-sectional illustration of substrate material layer prepared for fabrication of a device shown in FIG. 10F by a method represented in a sequence of cross-sectional views in FIGS. 10B-10F according to at least one embodiment.

FIG. 10A is a cross-sectional illustration of substrate material layer 502. Example materials include, but are not limited to: silicon, glass, copper, polyimide, and other electronics materials.

Figure 10B:
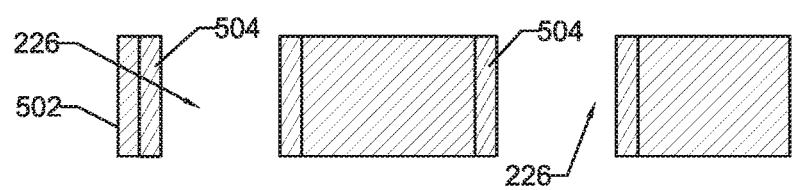
FIG. 10B is a cross-sectional illustration of the structure of FIG. 10A having chambers formed and a conductive material deposited on the walls of the chambers.

FIG. 10B is a cross-sectional view of the structure of FIG. 10A having chambers 226 formed such as by etching or other hole formation method. A conductive material 504 is deposited on the walls of the chambers. If metal is used as the substrate material layer (FIG. 10A), the chamber walls may be electrically isolated by an intervening insulating layer before depositing conductive material.

Figure 10C:
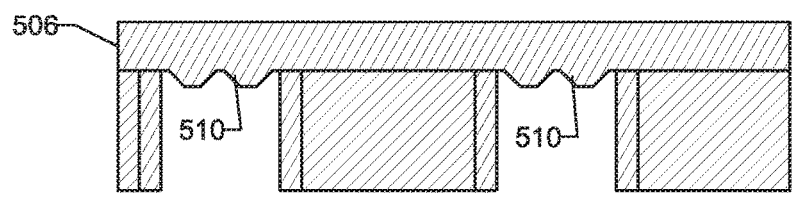
FIG. 10C is a cross-sectional illustration of the structure of FIG. 10B having a layer of conductive material on which surface features are previously formed

FIG. 10C is a cross-sectional view of the structure of FIG. 10B having a layer 506 of electrically conductive material, such as a metal, which may be copper for example. Surface features 510 are previously formed on the chamber-facing side of the layer 506 are faced into the chambers 226. The conductive layer 506 closes one end of each chamber.

Figure 10D:
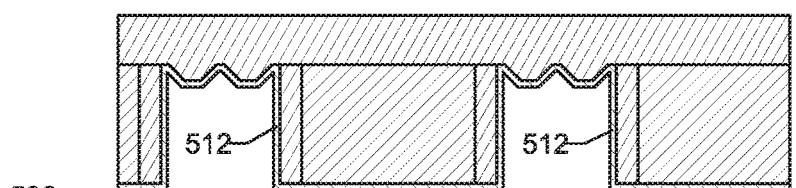
FIG. 10D is a cross-sectional view of the structure of FIG. 10C having flexible membrane layer conforming to the interior surface features.

FIG. 10D is a cross-sectional view of the structure of FIG. 10C having flexible membrane layer 512 additionally applied to the interiors of the conductive chamber walls and conductive closure layer 506 of FIG. 10C. The membrane layer 512 conforms to the interior surface features 510 of the conductive layer 506.

Figure 10E:
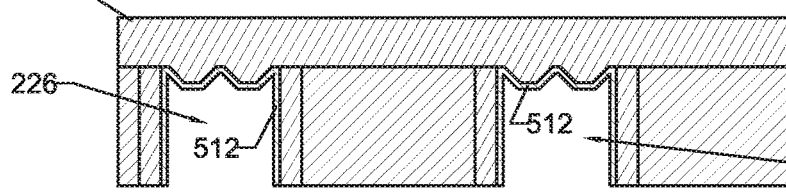
FIG. 10E is a cross-sectional illustration of the structure of FIG. 10D having the membrane layer material selectively removed.

FIG. 10E is a cross-sectional view of the structure of FIG. 10D having the membrane layer 512 material removed from the base of the structure opposite the conductive layer 506, leaving the membrane layer 512 coating the interiors of the chambers 226.

Figure 10F:
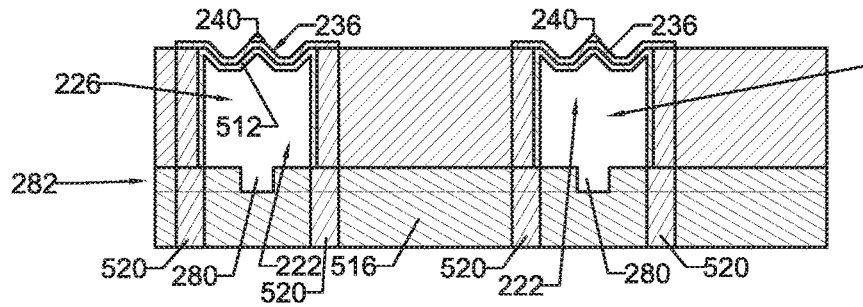
FIG. 10F is a cross-sectional illustration of the structure of FIG. 10E, having the conductive layer selectively removed leaving trace portions, and the structure joined to a substrate layer having microfluidic channels.

FIG. 10F is a cross-sectional view of the structure of FIG. 10E, having conductive layer 506 selectively etched or otherwise removed leaving trace portions 236 along the exteriors of the membrane layer 512. Contactor tips 240 are formed exterior to the remaining trace portions 236 of the conductive layer 506. The structure is also joined to a second substrate layer 516 having microfluidic channels 280 and 282 to complete fabrication of the device 500 according to at least one embodiment. Electrically conducting columns 520 pass entirely through the second substrate layer 516 to complete electrical contact from the traces 236 to the opposite side of the device 500.

The device 500 can be used similarly as the probe card or device 220 of FIGS. 2-4. The conducting columns 520 (FIG. 10F) serve a similar function as the posts 242 (FIG. 2) in establishing electrical communication from the tips 240 and traces 236 to the lower contacts 144 of the first joining mechanism 140 (FIG. 2). Fluid pressure applied to the interiors of the chambers 226 (FIG. 10F) via the microfluidic channels 280 and 282 causes extension of the membrane layer 512 which extends the contactor tips 240 to contact, for example, the contacts 112 of the semiconductor device 110 (FIG. 2).

Figure 11A:
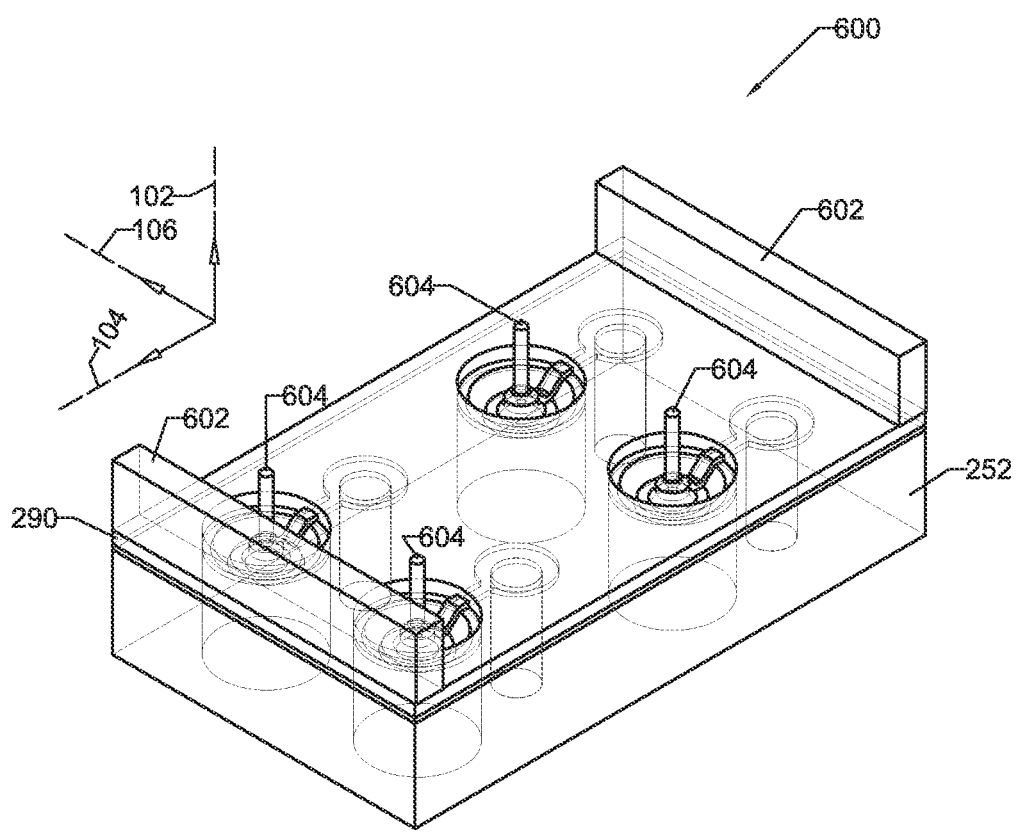
FIG. 11A is a perspective view of a device having spacers incorporated along marginal areas, according to at least one embodiment.
Figure 11B:
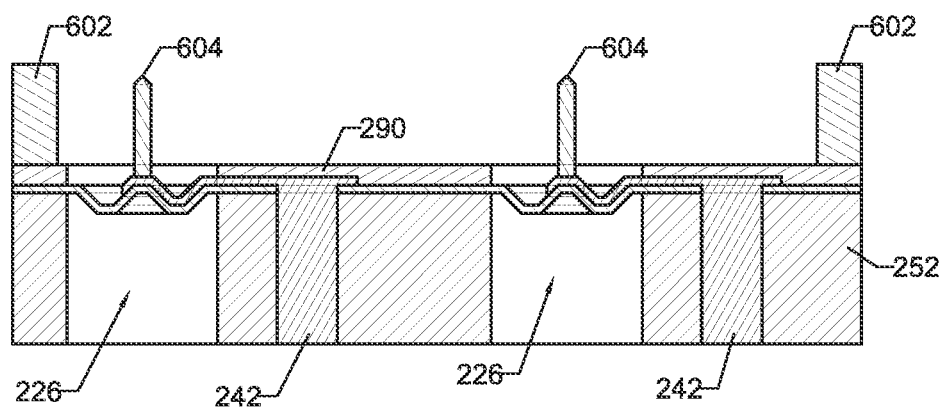
FIG. 11B is a cross-sectional illustration of the device of FIG. 11A.

In some cases, the active surface of wafer or semiconductor device 110 (FIG. 2) is preferably not to be touched other than at electrical contacts 112 due to sensitivity of the device 110. To accommodate, spacers can be formed on a probe card along marginal areas. FIG. 11A is a perspective view of a device 600 having spacers 602 incorporated along marginal areas such as dice separation lines (saw lines), and linearly extending contactor tips 604. FIG. 11B is a cross-sectional illustration of the device of FIG. 11A. The device 600 can be understood according to descriptions above with reference to, for example, FIG. 3 having several reference numbers in common with FIG. 11A relating to like features. In FIGS. 11A-B, marginal spacers 602 extend in a Z-axis 102 direction from the cover layer 290. Contactor tips 604 in FIGS. 11A-B bear similar function and arrangement as the contactor tips 240 in FIG. 3. The contactor tips 604 extend in the same Z-axis 102 direction as that of the spacers 602 to compensate for the height of the spacers 602.

Figure 12:
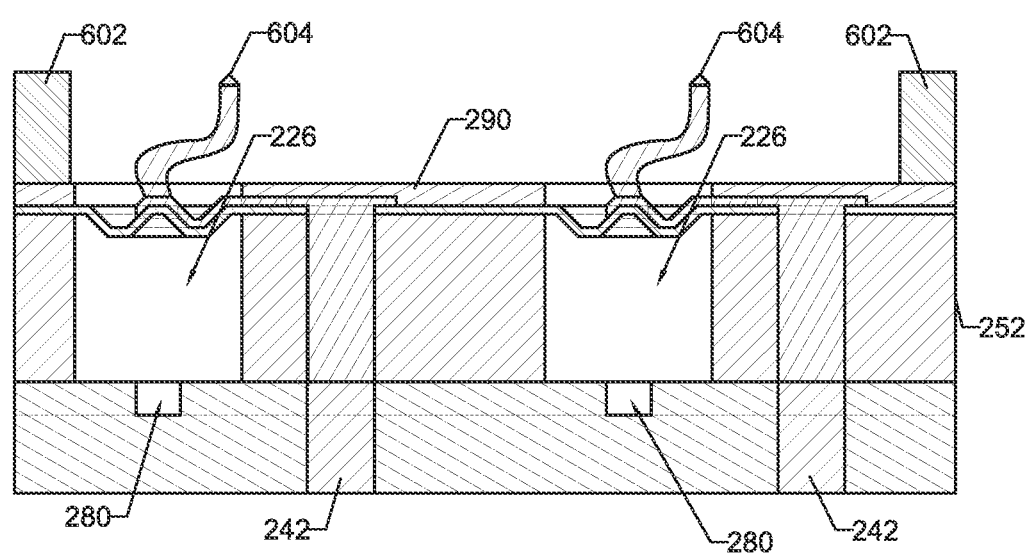
FIG. 12 is a cross-sectional illustration of a device having spacers as in FIGS. 11A-B, and curvilinearly extending contactor tips, according to at least one embodiment.

FIG. 12 is a cross-sectional illustration of a device 620 having spacers 602 as in FIGS. 11A-B, and curvilinearly extending contactor tips 622, according to at least one embodiment. The device 620 can be understood according to descriptions above with reference to, for example, FIG. 3 having several reference numbers in common with FIG. 12 relating to like features. The curvilinear contactor tips 604 extend in the same Z-axis 102 direction as that of the spacers 602 to compensate for the height of the spacers 602. Each contactor tip 604 includes an intermediate X and/or Y axis direction extension portion 606 that displaces the X-Y position of the distal contact end of the tip from the X-Y position of the central point of the membrane 224.

FIG. 13A is a perspective view of several embodiments of fluid-pressure driven probe actuators formed as various shapes. FIG. 13B is a plan view of the several embodiments of fluid-pressure driven probe actuators in FIG. 13A. Each is formed over a substrate layer 252 under an electrically insulating protective passivation or cover layer 290 (FIG. 13A).

Viewed along the Z-axis 102, normal to the cover layer 290, probe actuator 652 has a circular shape and a wedge-shaped conducting trace 654. Probe actuator 656 has a circular shape and perpendicularly crossing linear conducting traces 658. Probe actuator 662 has a circular shape and multiple wedge-shaped conducting traces 664. Probe actuator 666 has a circular shape and two partial-circularly shaped conducting traces 668 arranged diametrically opposite each other. Probe actuator 672 has an elongate rectangular shape and a linear strip conducting trace 674. Probe actuator 676 has a square shape and a linear strip conducting trace 678. Probe actuator 682 has a shape including an elongate rectangular portion and a circular portion, in which a linear strip conducting trace 684 extends along the rectangular portion to the center of the circular portion.

Each of these actuators has a membrane with a frustum portion that narrows in a Z-axis direction. The actuators 652, 656, 662 and 666 have central frustum portions 256 formed as circular cone portions having circular footprints when viewed along the Z-axis 102 as in FIG. 13B. The central frustum portion 256 may include an entire cone, including an apex, or may be a truncated cone. In the other embodiments in FIGS. 13A-B, the frustum portions are pyramid shaped, having square footprints when viewed along the Z-axis as shown in FIG. 13B.

The actuators 656 and 666 (FIGS. 13A-B), and those illustrated in FIG. 10F, have conducting traces with a high degree of symmetry, and thus are expected to extend and withdraw linearly along a Z-axis direction. Conversely, actuators 652, 662, 672, 676, 682 (FIGS. 13A-B) and actuators 222 (FIGS. 2-4, 6, 8 and 9F) have more asymmetric conducting trace arrangements, which are expected to cause some X-Y directional travel of conductor tips as the actuators are extended and withdrawn in Z-axis directions by fluid-pressure control. Such X-Y directional travel or wiping may be beneficial in some uses, by causing scratching of contact surfaces to improve electrical contact by removal or breaching of surface oxidation or contamination at electrical contacts, such as contacts 112 of the device 112 under testing in FIG. 2.

Figure 14:
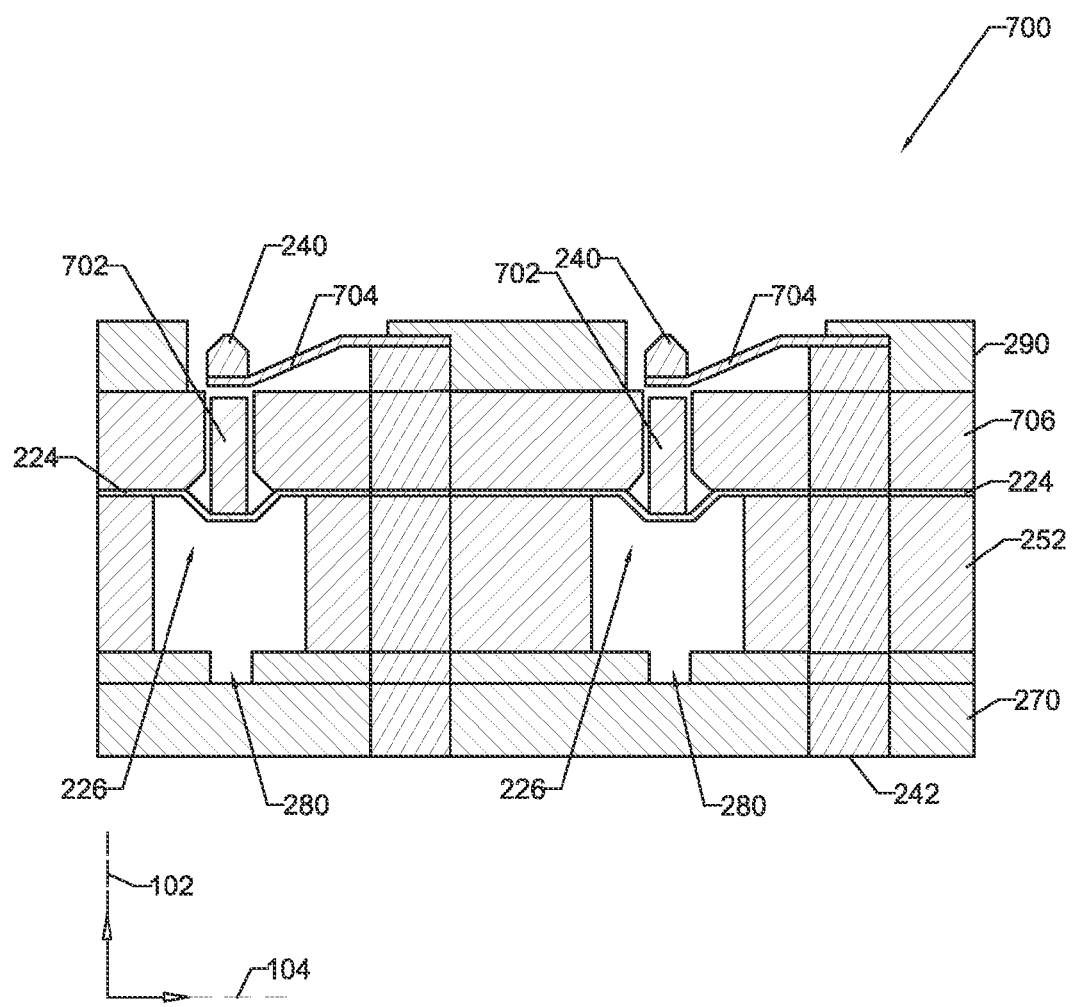
FIG. 14 is a cross-sectional illustration of a fluid-pressure actuatable device, according to at least one embodiment, having push rods that press electrically conducting flexible levers outward.

FIG. 14 is a cross-sectional illustration of a fluid-pressure actuatable device 700 having push rods 702 that press electrically conducting flexible levers 704 outward to bring contactor tips 240 into electrical contact with contacts of another device or structure. The device 700 has a membrane 224 above chambers 226, which are formed in a first substrate layer 252. Fluid pressure directed into the chambers 226 via the channels 280 in the second substrate layer 270 cause actuation of the device. The cover layer 290 defines the top surface of the device 200.

A spacer layer 706 is formed over the membrane 224. The push rods 702 are fixed in X-Y positions by holes formed through the spacer layer 706. The push rods 702 move in Z-axis 102 directions under fluid pressure control. Each push rod 702 presses upon a respective resilient flexible lever 704, which is connected to a respective conducting post 242, which passes through the device 700 to a bottom surface of the device, where bottom ends of the posts 242 define electrical contacts.

The membrane 224 presses upward when fluid pressure is applied. This raises the push rods 702, flexing the levers 704 outward and carrying the contactor tips 240 into contact with another device or structure, thus establishing electrical communication between bottom ends of the posts 242 and other device or structure contacted by the tips 240.

Figure 15:
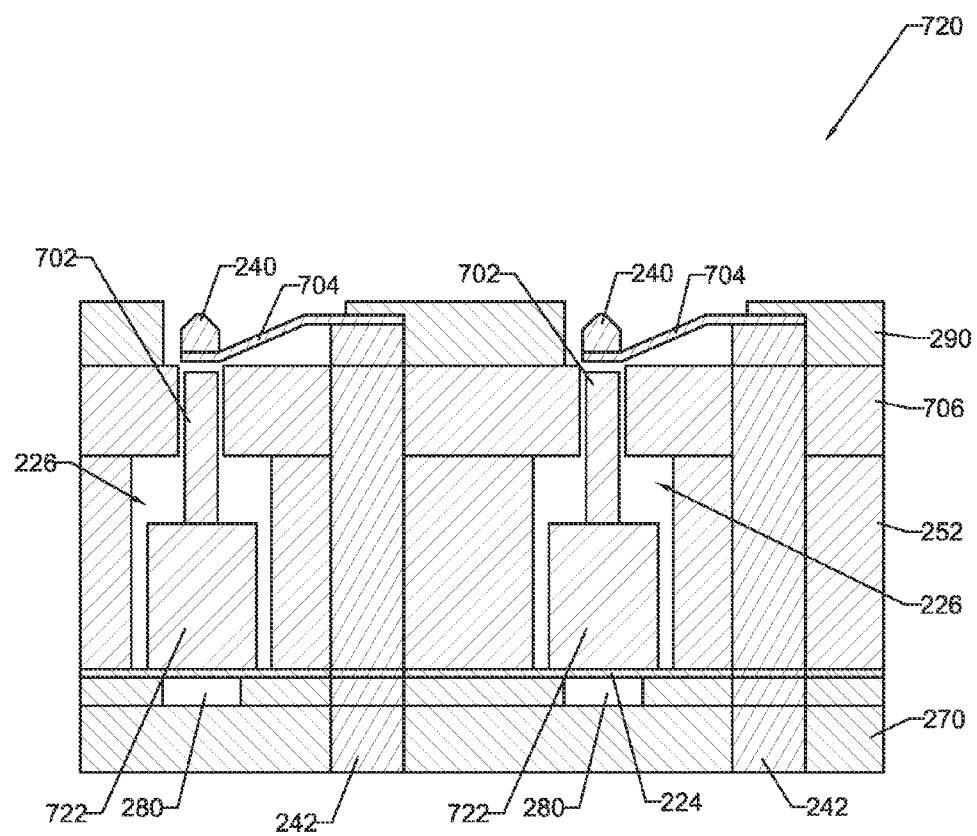
FIG. 15 is a cross-sectional illustration of another fluid-pressure actuatable device, according to at least one other embodiment, having push rods that press electrically conducting flexible levers outward.

FIG. 15 is a cross-sectional illustration of another fluid-pressure actuatable device 720 having push rods 702 that press electrically conducting flexible levers 704 outward to bring contactor tips 240 into electrical contact with contacts of another device or structure. In this embodiment, the membranes 224 are positioned below pistons 722 within the chambers 226. The pushrods 702 are positioned over the pistons 722. The membranes 224 press upward when fluid pressure is applied via the channels 280. This raises the pistons 722 and push rods 702, flexing the levers 704 outward and carrying the contactor tips 240 into contact with another device or structure, thus establishing electrical communication between bottom ends of the posts 242 and other device or structure contacted by the tips 240. In this case the membrane maybe constructed from stretchable material. Some types of Parylene for example can stretch two hundred percent. There is a variety of stretchable polymer and Silicones available.

The membranes 224 in FIGS. 14-15 can be pre-formed as having frustum portions over the chambers 226 (FIG. 14), or as flat (FIG. 15) in their relaxed shapes. Parylene C and/or other materials described herein may be used for stretchable flexible flat or otherwise shaped membranes. The pistons 722 and push rods 702 may be formed on silicon substrate or form by methods including but not limited to plating and etching.

In at least one embodiment, electrical contact force is mainly the function of fluidic pressure, even if in certain embodiments there a spring may reside over the membrane. It is also important to note that during the initial touchdown it is the goal to bring in contact the semi-conductor wafer first surface with the contactor substrate surface, while the contactor electrical tips are either not touching the wafer electrode pads (pressure in a chamber is less or equal than the pressure between the top surface of the membrane and the contactors are residing either below the surface of the contactor substrate or at the level of contactor substrate, so at the initial touchdown even if the pressure between the wafer surface and contactor substrate surface may exceed hundreds of mega Pascals, the force between the contactor tip and the wafer electrode pads is still close to zero or in single digit grams.

In at least one embodiment, at initial touchdown all the membranes just give way and without any resistance fall back in the cavities. This way it is proven that it is only the fluidic pressure which contributes to the main portion of the electrical contact force.

Frustums described above can have various shapes, including other shapes that are not shown in the drawings and those shown including squares, rectangles and odd shapes.

Regarding fluidic chamber communication: some chambers may not be connected to each other and in some embodiment as in a switching multiplexer, they need to be connected to a different fluidic pressure source.

There may be only one contactor over each membrane. That does not exclude the case where same contactor consists of multiple sub-contractors, all connected to the same electrical route.

Traditionally contactors built or attached to a space transformer or any other interposer, which interfaces the DUT board may be defined as a probe card. In embodiments described above, the contactor and micro fluidic channel substrate could be used as a stand-alone contactor substrate which may not need any permanent joining to any intermediate interposer or space transformer. Where these descriptions refer to a contactor and microfluidic substrate as a probe card, this reference is for example purposes only without otherwise limiting these descriptions. Thus, the above contactors can be used as a wafer and die level electrical testing contactors, switches, and can be used in multiplexers and RF switches, quick connects and disconnects and anywhere where temporary connections are needed between electrically conductive terminals.

A probe card or contactor substrate may not be a rigid substrate itself, it could have a flexible embodiment/version where, as whole, it could conform to any shape a semiconductor wafer may have. If the semiconductor wafer takes a convex or concave shape, a flexible contactor substrate can wrap over and conform to the shape. Once the two surfaces are locked, then the contactors itself can be activated using fluid pressure and it still contacts all the electrodes with close to identical force.

An advantage is not just the possibility to keep both the wafer and contactor flat, but also the capability to always have a conformal physical contact between the surface of the two, without exerting any force on the contactors and wafer electrode pads, until the contactors are activated/actuated using the external fluidic pressure.

The external pressure force which causes the surface to surface conformal contact could also be fluid pressure, bladder or mechanical, which conforms the two surfaces to each other, thus a smallest movement of the contactor caused by the fluidic pressure increase under the membrane will create electrical contact, since unlike conventional technologies most of the Z-Axis tolerance is already eliminated or neutralized by physical contact pressure.

A joining mechanism is not necessarily a board. It could have a collection of springs on a board or solder balls places on the terminals of the contactor and space transformer. It could be gold to gold, thermo-sonic or any method of joining (metal to metal and dielectric to dielectric) joining technologies.

A factor often behind probe card contactor failure is during burn-in tests, as due to temperature cycling, CTE mismatch between different material in semiconductor wafer and probe card construction causes warpage, independent of the initial planarity values between the wafer and the probe card contactor.

The probe card contactor can be built in its entirety in a wafer level format on a substrate equal to the final size of the wafer, or can be built in clusters or diced into pieces equal to the semiconductor chip size, and then being picked-placed and joined on a carrier substrate having corresponding conductive through vias. This way the total yield loss of the wafer will not have much effect of the cost of the device.

Where the semiconductor wafer electrode pads are made of aluminum, aluminum oxide may form on the electrode. It may be necessary to create a wiping scrub action at the time of contact of the contactors and wafer electrode pads. Asymmetric shaped contactor traces or asymmetric membrane shapes in combination of each other or by itself could results in non-vertical movement of the contactor under increased pressure. This will add a small X-Y component movement to the contactor tips along the Z axis movement to result in wiping actions, thus scratching the aluminum oxide on the wafer electrode pads, making a metal to metal low resistance electrical contact possible.

A larger pitch version of the single of double-sided contactor substrate could exactly be placed between the DUT and the space transformer to absorb some planarity or even totally overcome planarity issues. In some existing technologies, some sort of springs may be used to match and electrically connect the space transformer to the DUT board.

Particular embodiments and features have been described with reference to the drawings. It is to be understood that these descriptions are not limited to any single embodiment or any particular set of features, and that similar embodiments and features may arise or modifications and additions may be made without departing from the scope of these descriptions and the spirit of the appended claims.

What is claimed is:

1. A fluid pressure actuated device for establishing electrical contact, the device comprising:
    a rigid substrate defining a chamber;
    a three dimensional flexible membrane having a selected three dimensional shape having a first side facing a first direction away from the chamber and a second side facing into the chamber in a second direction opposite the first direction; and
    an electrically conducting contactor and a three dimensional electrically conductive trace mounted to the first side of the three dimensional flexible membrane, the electrically conductive trace conforming to the selected three dimensional shape and extending to an electrically conducting post,
    wherein the three dimensional flexible membrane extends and withdraws moving the electrically conducting contactor and electrically conductive trace in the first direction and second direction, respectively, when fluid pressure is increased and decreased in the chamber.

2. A fluid pressure actuated device according to claim 1, wherein the selected three dimensional shape comprises an undulating shape.

3. A fluid pressure actuated device according to claim 1, wherein the selected three dimensional shape comprises at least one frustum portion.

4. A fluid pressure actuated device according to claim 1, wherein the selected three dimensional shape comprises at least two concentric frustum portions that narrow in opposite directions.

5. A fluid pressure actuated device according to claim 4, wherein the at least two concentric frustum portions comprise a central frustum portion and a second frustum portion that encircles the central frustum portion.

6. A fluid pressure actuated device according to claim 5, wherein the central frustum portion narrows in the first direction and the second frustum portion narrows in the second direction.

7. A fluid pressure actuated device according to claim 5, wherein the central frustum portion and second frustum portion at least partially overlap along a Z-axis defined as parallel to the first direction.

8. A fluid pressure actuated device according to claim 7, wherein the substrate has a planar surface defining a normal that is parallel to the Z-axis.

9. A fluid pressure actuated device according to claim 1, wherein:
the selected three dimensional shape comprises a central first cone portion;
a second cone portion encircling the first cone portion; and
the first cone portion and second cone portion narrow in opposite directions.

10. A fluid pressure actuated device according to claim 1, further comprising an electrically conducting post in electrical communication with the electrically conducting contactor and extending in the second direction at least partially through the substrate.

11. A fluid pressure actuated device according to claim 1, further comprising:
a second three dimensional flexible membrane having a second selected three dimensional shape first side facing the first direction and a second side facing the second direction into a second chamber defined by the rigid substrate; and
a second electrically conducting contactor mounted on the first side of the second three dimensional flexible membrane, wherein the first chamber and second chamber are in fluid communication through at least one channel defined by the rigid substrate.

12. A fluid pressure actuated device according to claim 11, wherein the first chamber and second chamber are maintained in pressure equilibrium by the at least one channel.

13. A method making electrical contact, the method comprising:
providing the fluid pressure actuated device of claim 1;
isolating a mechanical contact force from an electrical contact force by using the three dimensional membrane on which a contactor tip is disposed by, at the moment of establishment of the mechanical contact force, the contactor tip is either residing below a surface or falls back under the surface without significant resistance, while the mechanical contact force locks the surface from warping, wherein Z-axis movement of the contactor tip once activated by fluid pressure source creates a uniform and controllable electrical contact force, where it can be terminated or activated for a cluster or group of selected contactors.

14. A fluid pressure actuated device for concurrently establishing multiple electrical contacts, the device comprising:
a rigid substrate defining multiple chambers interconnected by at least one channel;
multiple three dimensional flexible membranes, each having a selected three dimensional shape and a first side facing a first direction away from the substrate and a second side facing into a respective one of the multiple chambers in a second direction opposite the first direction; and
multiple electrically conducting contactors and multiple three dimensional electrically conductive traces each of which traces conforms to the respective selected shape of the three dimensional flexible membranes, each contactor and trace mounted, to the first side of a respective one of the multiple three dimensional flexible membranes the trace extends to an electrically conducting post;
wherein the multiple three dimensional flexible membranes extend and withdraw concurrently, moving the multiple electrically conducting contactors and electrically conductive traces in the first direction and second direction when fluid pressure is increased and decreased respectively in the multiple chambers.

15. A fluid pressure actuated device according to claim 14, wherein each three dimensional flexible membrane comprises at least one frustum portion.

16. A fluid pressure actuated device according to claim 14, wherein each three dimensional flexible membrane comprises at least two concentric frustum portions that narrow in opposite directions.

17. A fluid pressure actuated device according to claim 16, wherein the at least two concentric frustum portions comprise a central frustum portion and a second frustum portion that encircles the central frustum portion.

18. A fluid pressure actuated device according to claim 17, wherein the central frustum portion narrows in the first direction and the second frustum portion narrows in the second direction.

19. A fluid pressure actuated device according to claim 14, wherein the multiple chambers are maintained in pressure equilibrium by at least one channel.

20. A fluid pressure actuated device according to claim 14, further comprising:
multiple second chambers defined by the rigid substrate and interconnected by at least one second channel;
multiple second three dimensional flexible membranes, each having a first side facing the second direction away from the rigid substrate and a second side facing into a respective one of the multiple second chambers in the first direction; and
multiple second electrically conducting contactors, each mounted on the first side of a respective one of the multiple second three dimensional flexible membranes;
wherein the multiple second three dimensional flexible membranes extend and withdraw concurrently moving the multiple second electrically conducting contactors in the second direction and first direction when fluid pressure is increased and decreased respectively in the multiple second chambers.

* * * * *